United States Patent
Mokhtari

(10) Patent No.: US 8,106,802 B2
(45) Date of Patent: Jan. 31, 2012

(54) OPTO-ELECTRONIC ANALOG-TO-DIGITAL CONVERTER

(75) Inventor: Mehran Mokhtari, Thousand Oaks, CA (US)

(73) Assignee: Tialinx, Inc., Newport Beach, CA (US)

( * ) Notice: Subject to any disclaimer, the term of this patent is extended or adjusted under 35 U.S.C. 154(b) by 0 days.

(21) Appl. No.: 12/340,633

(22) Filed: Dec. 19, 2008

(65) Prior Publication Data

US 2009/0189797 A1    Jul. 30, 2009

Related U.S. Application Data

(60) Provisional application No. 61/015,041, filed on Dec. 19, 2007.

(51) Int. Cl.
*H03M 1/00* (2006.01)

(52) U.S. Cl. .......................... 341/137; 341/155

(58) Field of Classification Search .................. 341/137, 341/155, 144, 143; 359/558, 578
See application file for complete search history.

(56) References Cited

U.S. PATENT DOCUMENTS

| | | | | |
|---|---|---|---|---|
| 5,225,930 A * | 7/1993 | Land et al. | | 359/578 |
| 5,596,436 A * | 1/1997 | Sargis et al. | | 398/76 |
| 5,610,346 A * | 3/1997 | Stelts | | 73/866.5 |
| 6,288,659 B1 * | 9/2001 | Jalali et al. | | 341/137 |
| 6,469,649 B1 * | 10/2002 | Helkey et al. | | 341/155 |
| 6,526,075 B2 * | 2/2003 | Mizutani | | 372/27 |
| 6,542,277 B2 * | 4/2003 | Lange et al. | | 398/202 |
| 6,717,967 B2 * | 4/2004 | Cliche et al. | | 372/32 |
| 7,529,481 B1 * | 5/2009 | Doerr et al. | | 398/16 |
| 2008/0212974 A1 * | 9/2008 | Davies et al. | | 398/140 |
| 2009/0092158 A1 * | 4/2009 | Izadpanah et al. | | 372/18 |

* cited by examiner

*Primary Examiner* — Peguy Jean Pierre
(74) *Attorney, Agent, or Firm* — Haynes and Boone, LLP

(57) ABSTRACT

In one embodiment, an opto-electronic analog-to-digital converter is provided that includes: an optical comb generator for generating a plurality of optical comb lines; a tunable optical filter adapted to select a portion of the optical comb lines responsive to an analog signal being digitized; a diffractive media for spatially mapping the selected optical comb lines and an array of photodetectors for detecting the spatially mapped optical comb lines.

12 Claims, 4 Drawing Sheets

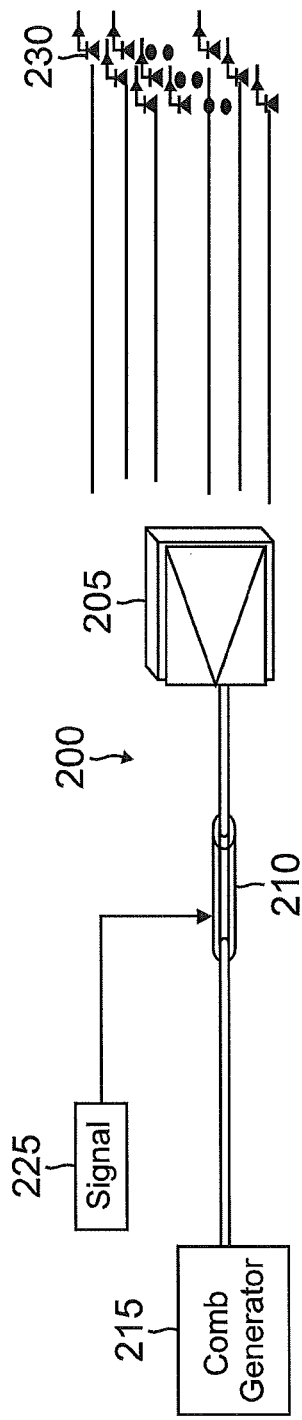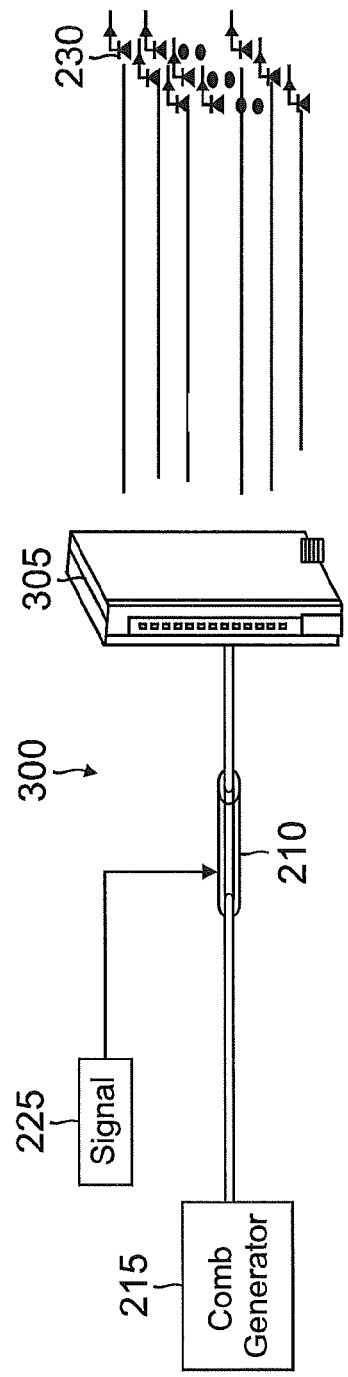

OPTO-ELECTRONIC ANALOG-TO-DIGITAL CONVERTER

RELATED APPLICATION

This application claims the benefit of U.S. Provisional Application No. 61/015,041, filed Dec. 19, 2007, the contents of which are hereby incorporated by reference in their entirety.

BACKGROUND

Advances in technologies such as wireless communications or imaging applications demand ever faster analog-to-digital converters so that high bandwidth signals may be digitized with more resolution. Various approaches have been developed such as averaging multiple high-speed analog-to-digital converters to increase dynamic range. But these approaches tend to be costly and unable to keep up with sampling rates demanded by high frequency, high bandwidth signals. Accordingly, there is a need in the art for improved high-speed analog-to-digital converter architectures.

SUMMARY

In accordance with one aspect of the invention, an opto-electronic analog-to-digital converter is provided that includes: an optical comb generator for generating a plurality of optical comb lines; a tunable optical filter adapted to select a portion of the optical comb lines responsive to an analog signal being digitized; a diffractive media for spatially mapping the selected optical comb lines and an array of photodetectors for detecting the spatially mapped optical comb lines.

The invention will be more fully understood upon consideration of the following detailed description, taken together with the accompanying drawings.

BRIEF DESCRIPTION OF THE DRAWINGS

FIG. 2 is a block diagram of an opto-electronic analog-to-digital converter (OE-ADC) that uses a diffractive media to spatially map selected comp lines.

FIG. 3 is a block diagram of an OE-ADC that uses a microdisk resonator array to spatially map selected comp lines.

DETAILED DESCRIPTION

Reference will now be made in detail to one or more embodiments of the invention. While the invention will be described with respect to these embodiments, it should be understood that the invention is not limited to any particular embodiment. On the contrary, the invention includes alternatives, modifications, and equivalents as may come within the spirit and scope of the appended claims. Furthermore, in the following description, numerous specific details are set forth to provide a thorough understanding of the invention. The invention may be practiced without some or all of these specific details. In other instances, well-known structures and principles of operation have not been described in detail to avoid obscuring the invention.

Figure 1:
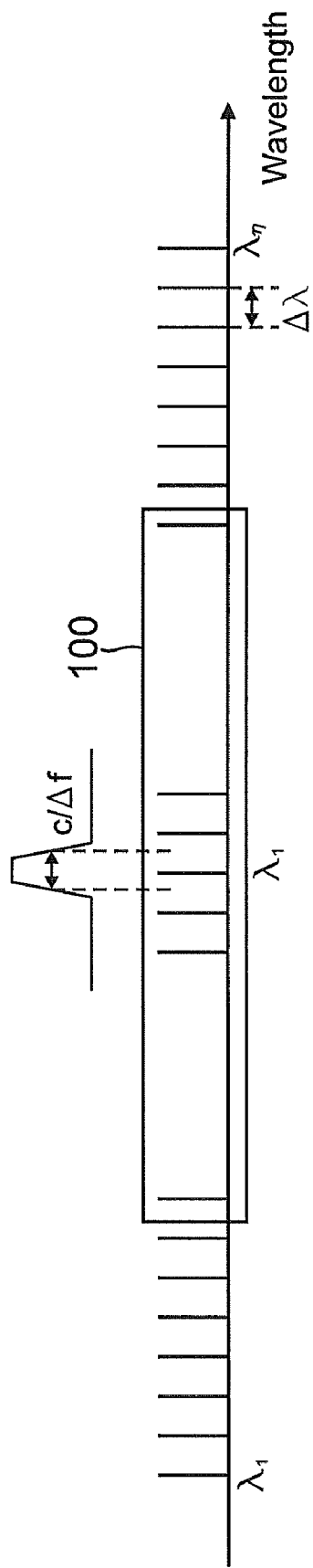
FIG. 1 illustrates an optical comb line spectrum.

To provide an ultra-fast yet high resolution analog-to-digital converter architecture, an optical comb generator may be filtered responsive to the signal being digitized. FIG. 1 illustrates an example spectrum from an optical comb generator. The comb lines are separated by a wavelength separation $\Delta\lambda$ as determined by the pulsing rate of the optical comb generator such as a mode-locked laser (MLL). A tunable filter such as a bandpass (BP) filter selects a certain portion 100 of the comb lines responsive to an analog signal. As will be discussed further, the selected comb lines are detected in photodetectors such that resulting electrical signals from the photodetectors represents a particular logical state of a digitized version of the analog signal. Alternatively the portion selected may be blocked by a bandstop (BS) filter. In such a case, the passed comb lines represent the complement of those comb lines selected by a corresponding bandpass filter having the same bandwidth tuning.

It may be immediately appreciated the technological advance such an arrangement provides in the analog-to-digital converter arts: the sampling by the optical comb occurs at the pulse rate driving the comb generation, which is typically on the order of 10 GHz or even higher such as 20 GHz. Yet even with such a sample rate, substantial resolution may be obtained—for example, if the bandpass filter can be modulated across a set of 2048 comb lines but the bandpass filter only passes 1024 of these lines, there are 1024 uniquely different sets of comb lines that may be passed as the bandpass filter is modulated by the analog signal being digitized. Such an arrangement thus provides 10 bits of resolution at ultra-fast sampling rates such as 10 GHz or higher.

To complete an analog-to-digital converter, the passed comb lines from the tunable bandpass (or bandstop) filter should be uniquely distributed to corresponding photo detectors. This distribution may be performed in a number of fashions such as through the use of diffractive media or a resonator array. FIG. 2 illustrates an example opto-electronic (OE) analog-to-digital converter (ADC) 200 that uses a diffractive media 205 to distribute the passed comb lines from a tunable BP (or B S) optical filter 210 that is excited by an optical comb line generator 215 such as a MLL. An analog signal 225 to be digitized modulates tunable filter 210 as discussed above. Suitable tunable optical filters 210 have been developed for various wavelength selections as used, for example, in optical routing and switching applications for optical communication systems. Suitable diffractive media 205 include kinoform or fiber with grating can be used. The use of kinoform enables compact integrated solutions. Furthermore, some first-order encoding can be implemented in the kinoform patterns to minimize the number of digital channels to be directed to a corresponding bank of photo detectors 230. For example, a thermometer code to binary conversion, in a 10-bit conversion, will reduce the number of channels, and thereby photo detectors, from 1024 to 10.

An alternative OE-ADC 300 is illustrated in FIG. 3 in which the wavelength-to-position mapping by the diffractive media of FIG. 2 is performed by an array of micro-disk resonators (MDR) 305. As known in the optical arts, MDR arrays may be constructed in a semiconductor Si, InP, InGaAsP, or other suitable substrate using techniques such as polymer wafer bonding. Each MDR is of band-pass character with extremely high quality-factor; therefore, each passed comb line can be devoted to an MDR of proper center-frequency. The center frequency is defined by the resonator's properties such as its dimensions. By controlling an injected current into the MDR, a measure of amplitude and frequency control is achieved. The filtered optical wavelengths from the MDR array are then guided through waveguides to an appropriately packed array of photodetectors 230 so that the logical state of the digitized version of signal 225 may be determined.

Figure 4:
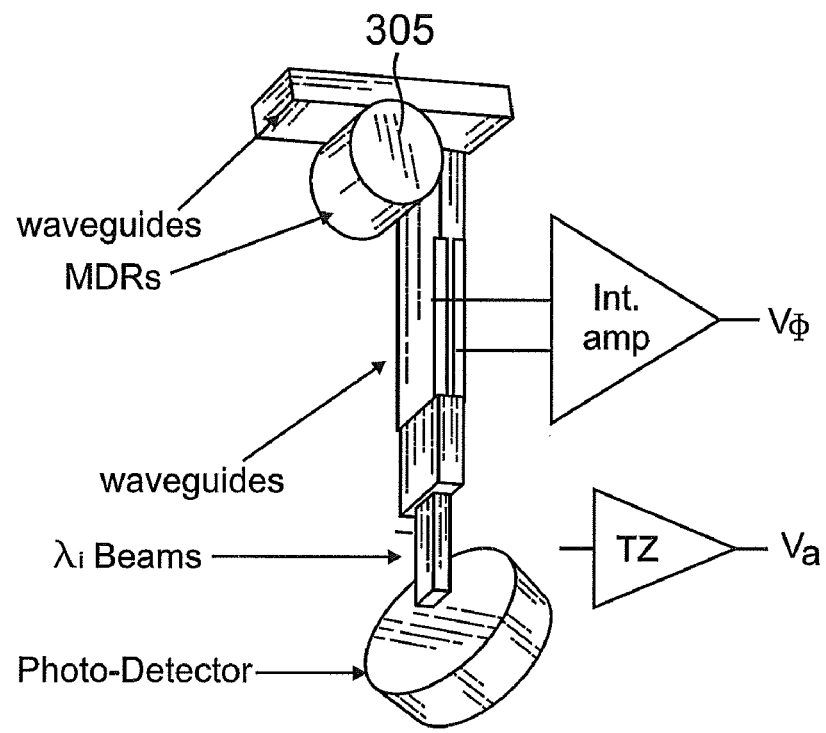
FIG. 4 is illustrates a micro-disk array and photodetector optical assembly.

An example MDR array and corresponding array of photodetectors is illustrated in FIG. 4. The center frequency of an MDR is driven by a current injected into its cavity. This current is imposed by a trans-admittance (TY) amplifier (shown in FIGS. 5 and 6). The amplitude of the optical signals passed by the MDRs is detected by reading the response from the photo-detectors as amplified by, for example, corresponding trans-impedance (TZ) amplifiers. The optical comb lines are coupled to the MDR array through a first waveguide set (shown at the upper part of FIG. 4). The response of the MDR array couples through a second waveguide set to the corresponding photodetectors. As will be explained further herein, the tuning of the MDR array may be controlled through conventional low-speed analog-to-digital and digital-to-analog converters (DACs).

Due to real-world limitations in photolithography, the accuracy by which the pass-band and center frequency of an MDR are determined may be insufficient to accurately pass only a desired comb line (or lines). Indeed, photolithography variations and inaccuracies may produce an MDR with an uncertainty of its center frequency equivalent to tens or even hundreds of consecutive optical comb line wavelengths. Thus, further electronic tuning of each MDR may be enabled to ensure correct allocation of an MDR pass band to a corresponding optical comb line at the desired wavelength. This alignment procedure may be performed in three steps:

1. Align the pass-band of a first resonator (MDR) to a wavelength at the beginning of the optical comb (or at the beginning of a comb line interval of interest);
2. Align the consecutive MDRs to the consecutive comb line wavelengths; and
3. Lock the center frequencies of the MDR pass-bands to the corresponding wavelengths as selected in steps 1 and 2.

Figure 5:
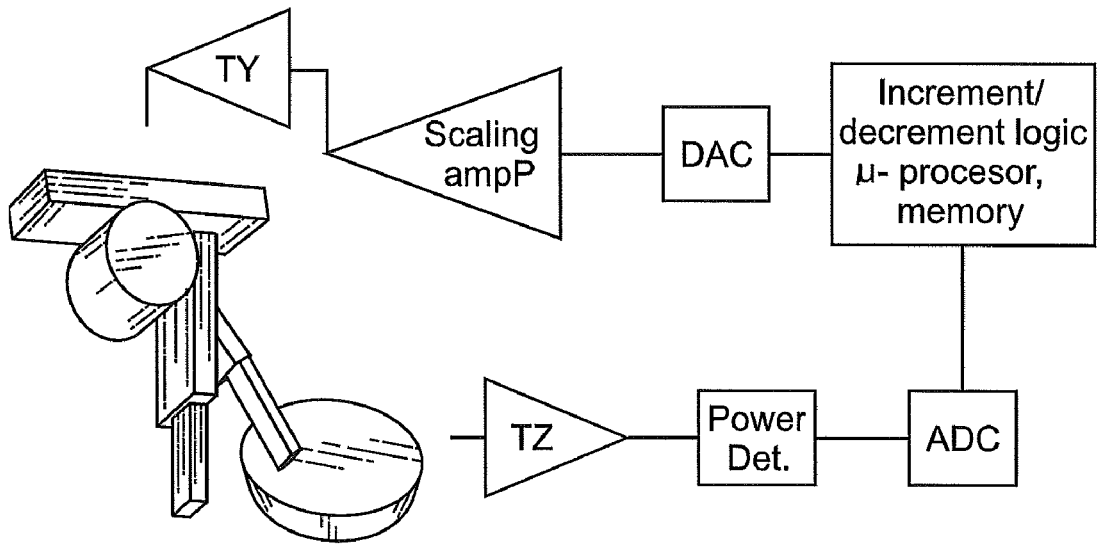
FIG. 5 illustrates circuitry for coarse tuning the microdisk array of FIG. 4.

These steps may now be described in more detail, starting with a coarse tuning step 1 as explained with reference to FIG. 5, which illustrates an example MDR array and corresponding array of photodetectors. As discussed previously, the center frequency of an MDR is driven by a current injected into its cavity. This current is imposed by a trans-admittance (TY) amplifier.

A search procedure is commenced, at power-up, by sinking or sourcing a first MDR with a tuning current. The current is generated by a TY-amplifier, driven by a DAC. At each current-step (corresponding to a wavelength change of at least one-half the comb line wavelength separation $\Delta\lambda$), the proportional current, measured at the photo-detector, is integrated by an integrating amplifier (shown in FIG. 4) with a sufficient time constant (for illustration purposes, the integrating amplifier is shown coupling to the second set of waveguides). Referring again to FIG. 5, the resulting integrated signal is detected in a power detector and digitized in an ADC. Should the measured current exceed a predefined value, the DAC input word is registered as an electronic position of pass-band overlap on wavelength. This procedure is repeated for the complete range of the DAC and/or tuning range of the MDR (depending on which one defined the ultimate limitations). As seen in FIG. 5, the logic to decrement or increment the DAC input word so that the optical comb frequency is scanned may be implemented in a microprocessor having corresponding memory. The analog output of the DAC may then be scaled appropriately in a scaling amplifier before it drives the TY amplifier. When the whole optical comb range has been scanned and classified, the first MDR is tuned to a value corresponding to the lowest detected wavelength position. Requirements on the resolution of the DAC and integration time of the integrator should be kept to practical values. Consequently, this procedure will be a coarse tuning.

Step 2

The same coarse tuning procedure is repeated for all the following MDRs with one additional step: when decrementing the DAC value to detect the "next" wavelength, an additional detector is used. This detector is illuminated with the wavelength from the previous MDR as well as the current one. While the RF power is being measured, the detector, illuminated with two wavelengths, will be measured for presence of RF power. Once an overlap of pass-band to a wavelength is detected, and the second detector is verified to exhibit only DC-current, the DAC value is registered as the tuning current value for the current MDR.

The above steps will allow for masking defect channels. By properly processing the registered values of the DACs, enough information is retrieved to ensure that the "operational" MDRs are tuned to consecutive wavelengths.

Step 3

Figure 6:
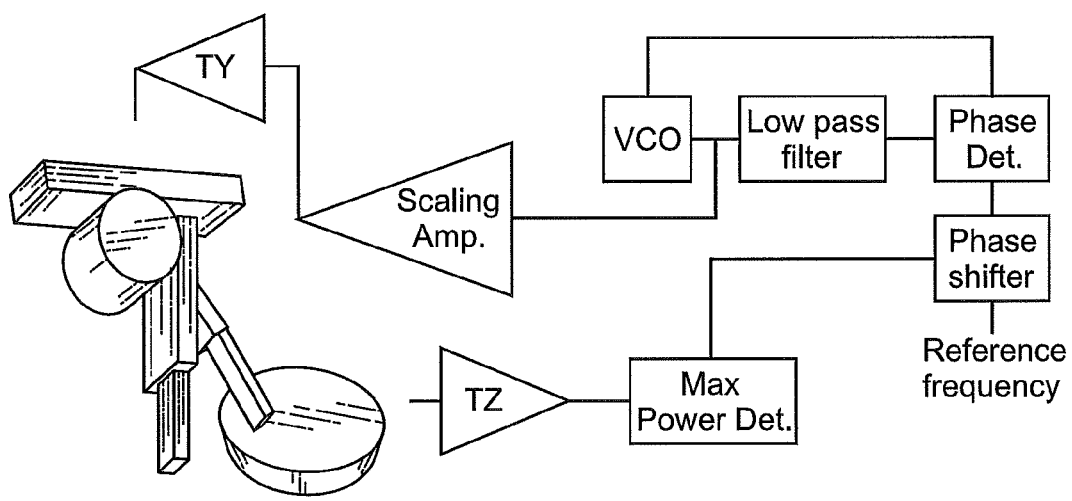
FIG. 6 illustrates circuitry for fine tuning the microdisk array of FIG. 4.

Once the coarse tuning is concluded, the fine tuning procedures commence as explained with reference to FIG. 6. The center-frequency of each MDR is locked to the comb-wavelengths, to achieve a continuous tracking and readjustment of the band-pass characteristics of the MDRs, caused by frequency drift, temperature changes, etc. The structure requires a reference frequency. The best and simplest solution, from a size and power consumption point of view, requires the reference frequency to be the same as the repetition rate of the combs (also equal to the wavelengths' spacing $\Delta\lambda$, $f=c/\Delta\lambda$). While a low noise source can be implemented on the chips, it is preferred to use the reference from the comb-generator. This reference should also be provided to the encoder/decoder circuits for synchronization purposes. The first MDR is phase and frequency locked (Phase/Frequency Locked Loop, PFLL) to the comb-source by using the phase shifter, phase detector, low pass filter and VCO accordingly. A DC-reference current is extracted from the locking loop and scaled to drive the MDR tuning port through the TY amplifier. The optical power from the first channel/MDR is measured through the corresponding photo-detector, and the phase relation between the reference frequency and the on-board PFLL is set to achieve maximum power. Once the locking condition is achieved, all the following MDRs (channels) are locked with a frequency difference corresponding to the reference source's frequency ($\Delta f=c/\Delta\lambda$). For every channel, the following procedure is implemented: A portion of the optical power from the corresponding MDR ($\lambda i$) is tapped and directed to a photo-detector. The signal is then correlated with the optical power of the previous MDR ($\lambda i-1$) to create a beat frequency of $\Delta f$. The output of the detector will now function as the reference frequency for the MDR ($\lambda i$). The tuning current of the MDR ($\lambda i$) is changed to achieve maximum RF power from the detector.

All the consecutive channels' MDR-center-frequencies are, in this manner, adjusted for best alignment. Furthermore, any changes in the comb-generators reference frequency will automatically be tracked and corrected for.

Referring back to FIG. 4, an advantageous ASIC maybe implemented with the electronic parts and photo-detectors integrated on the same chip. The optical functions, waveguides, MDRs, etc. are integrated on a separate chip. The two chips can be aligned over each other to achieve a compact Photonic Integrated Circuit (PIC).

Figure 7:
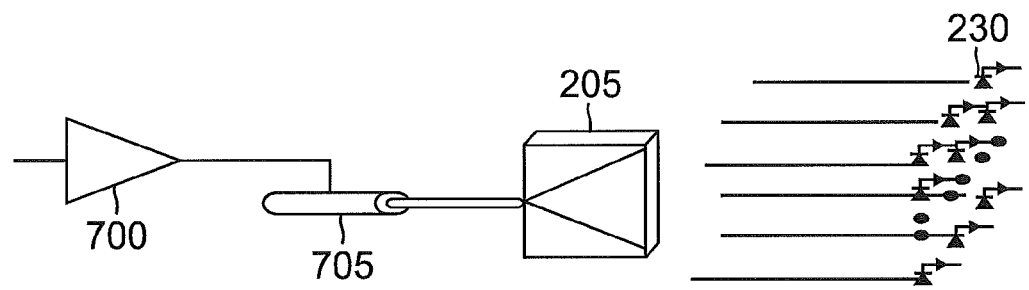
FIG. 7 is a block diagram of an OE-ADC that uses a wavelength tunable laser source.

An alternative OE-ADC embodiment may be implemented that does not use an optical comb but instead uses a wavelength-tunable laser that is modulated by the analog signal being digitized as illustrated in FIG. 7. For example, a low-noise amplifier (LNA) 700 may amplify the analog signal to provide a tuning signal to the wavelength-tunable laser 705. The resulting pulsed laser signal may then be spatially mapped as discussed with regard to FIGS. 2 and 3. In the embodiment of FIG. 7, diffractive media 205 performs this spatial mapping.

It will be obvious to those skilled in the art that various changes and modifications may be made without departing from this invention in its broader aspects. The appended claims encompass all such changes and modifications as fall within the true spirit and scope of this invention.

I claim:

1. An opto-electronic analog-to-digital converter (OE-ADC), comprising:
   an optical comb generator for generating a plurality of optical comb lines;
   a tunable optical filter adapted to select a portion of the optical comb lines responsive to an analog signal being digitized, wherein the selected portion of the optical comb lines differs in frequency responsive to an amplitude of the analog signal;
   a diffractive media for spatially mapping each of the different selections of the optical comb lines into different spatial mappings such that different amplitudes of the analog signal map into different spatial mappings; and
   an array of photodetectors for detecting the different spatial mappings so as to digitize the analog signal.

2. The OE-ADC of claim 1, wherein the tunable optical filter is a bandpass filter.

3. The OE-ADC of claim 1, wherein the tunable optical filter is a bandstop filter.

4. The OE-ADC of claim 1, wherein the diffractive media comprises a Kinoform media.

5. The OE-ADC of claim 1, wherein the diffractive media comprises a grating.

6. An opto-electronic analog-to-digital converter (OE-ADC), comprising:
   an optical comb generator for generating a plurality of optical comb lines;
   a tunable optical filter adapted to select a portion of the optical comb lines responsive to an analog signal being digitized, wherein the selected portion of the optical comb lines differs in frequency responsive to an amplitude of the analog signal;
   an array of microdisk resonators (MDRs) for spatially mapping each of the different selections of the optical comb lines into different spatial mappings such that different amplitudes of the analog signal map into different spatial mappings; and
   an array of photodetectors for detecting the different spatial mappings so as to digitize the analog signal.

7. The OE-ADC of claim 6, wherein the tunable optical filter is a bandpass filter.

8. The OE-ADC of claim 6, wherein the tunable optical filter is a bandstop filter.

9. A method of digitizing an analog signal; comprising:
   generating a plurality of optical comb lines;
   tuning a tunable optical filter responsive to the analog signal;
   filtering the optical comb lines through the tuned tunable optical filter to select different portions of the optical comb lines having different frequencies responsive to an amplitude of the analog signal; and
   spatially mapping each of the different selected portions into different spatial mappings such that different amplitude of the analog signal map into different spatial mappings; and
   detecting the different spatial mappings to produce a digitized version of the analog signal.

10. The method of claim 9, wherein spatially mapping the different selected portions of the optical comb lines comprises diffracting the different selected portions of the optical comb lines with a grating.

11. The method of claim 9, wherein the tunable optical filter comprises a tunable bandpass optical filter such that the filtering act comprises selecting a bandpass set of comb lines responsive to the analog signal.

12. The method of claim 9, wherein the tunable optical filter comprises a tunable bandstop optical filter such that tuning the filtering act comprises selecting a set of comb lines outside a bandstop responsive to the analog signal.

* * * * *